(12) United States Patent
Ding et al.

(10) Patent No.: US 12,014,935 B2
(45) Date of Patent: Jun. 18, 2024

(54) INTERPOSER AND METHOD OF MANUFACTURING THE INTERPOSER

(71) Applicant: Samsung Electronics Co., Ltd., Suwon-si (KR)

(72) Inventors: Shaofeng Ding, Suwon-si (KR); Jeong Hoon Ahn, Seongnam-si (KR); Yun Ki Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 61 days.

(21) Appl. No.: 15/931,738

(22) Filed: May 14, 2020

(65) Prior Publication Data

US 2021/0118696 A1 Apr. 22, 2021

(30) Foreign Application Priority Data

Oct. 21, 2019 (KR) .......................... 10-2019-0130659

(51) Int. Cl.
| | |
|---|---|
| *H01L 21/311* | (2006.01) |
| *H01L 21/48* | (2006.01) |
| *H05K 3/10* | (2006.01) |
| *H01L 23/64* | (2006.01) |

(52) U.S. Cl.
CPC .......... *H01L 21/486* (2013.01); *H05K 3/107* (2013.01); *H01L 23/642* (2013.01)

(58) Field of Classification Search
CPC ............................ H01L 21/308; H01L 21/311
See application file for complete search history.

(56) References Cited

U.S. PATENT DOCUMENTS

| | | | |
|---|---|---|---|
| 5,656,526 A * | 8/1997 | Inada | H01L 27/124 438/30 |
| 7,469,401 B2 | 12/2008 | Bhattacharya et al. | |
| 9,257,383 B2 | 2/2016 | England | |
| 9,741,669 B2 | 8/2017 | Wei et al. | |
| 10,002,865 B2 | 6/2018 | Or-Bach et al. | |
| 2007/0026625 A1* | 2/2007 | Chung | H01L 21/022 438/785 |
| 2008/0048291 A1* | 2/2008 | Chung | H01L 21/02381 257/532 |
| 2010/0032801 A1* | 2/2010 | Jacobs | H01L 23/5223 257/532 |

(Continued)

FOREIGN PATENT DOCUMENTS

KR 10-2017-0023713 A 3/2017

*Primary Examiner* — Thomas T Pham
(74) *Attorney, Agent, or Firm* — Harness, Dickey & Pierce, P.L.C.

(57) ABSTRACT

The method of manufacturing an interposer includes providing a substrate including a first region and a second region adjacent to the first region, forming a first mold structure on the substrate, forming a photoresist layer on the first mold structure, forming a first transfer pattern over the photoresist layer on the first region, using a first photomask, forming a second transfer pattern over the photoresist layer on the second region, using the first photomask, forming a mask pattern on the first mold structure, using the first transfer pattern and the second transfer pattern and forming a first trench and a second trench in the first mold structure, using the mask pattern, the first trench being formed in the first region, and the second trench being formed in the second region.

20 Claims, 15 Drawing Sheets

(56) References Cited

U.S. PATENT DOCUMENTS

| | | | |
|---|---|---|---|
| 2010/0130003 A1* | 5/2010 | Lin | H01L 25/50 |
| | | | 257/E21.159 |
| 2011/0227186 A1* | 9/2011 | Chang | H01L 24/02 |
| | | | 257/E31.124 |
| 2015/0332996 A1 | 11/2015 | Kuo et al. | |
| 2016/0233333 A1* | 8/2016 | Toh | H10N 50/01 |
| 2019/0148166 A1 | 5/2019 | Wei et al. | |
| 2019/0164899 A1 | 5/2019 | Hu et al. | |

\* cited by examiner

INTERPOSER AND METHOD OF MANUFACTURING THE INTERPOSER

This application claims the benefit of Korean Patent Application No. 10-2019-0130659, filed on Oct. 21, 2019, in the Korean Intellectual Property Office, the disclosure of which is incorporated herein in its entirety by reference.

BACKGROUND

1. Field of the Invention

Some example embodiments of the inventive concepts relate to interposers and/or methods of manufacturing the same, and more particularly, to photolithography processes when manufacturing an ISC (Integrated stacked capacitor) inside interposers.

2. Description of the Related Art

As part of enhancement of competitiveness in the semiconductor industry, individual unit processes capable of ensuring high production yields are being developed, and research and development on the photo-lithographic process for reducing process errors and costs in each unit process are being sequentially performed.

For example, a semiconductor element includes a plurality of insulating layers and conductive layers formed on a wafer, and the patterns thereof are formed by being exposed, developed, and etched in accordance with a mask pattern such as a photoresist pattern.

SUMMARY

Some aspects of the inventive concepts reduce the number of ISC photomasks in a photo-lithographic process, which is utilized when manufacturing an ISC (Integrated stacked capacitor) which is a repeated structure inside an interposer.

In one embodiment, a method of manufacturing an interposer comprises providing a substrate including a first region and a second region adjacent to the first region, forming a first mold structure on the substrate, forming a photoresist layer on the first mold structure, forming a first transfer pattern over the photoresist layer on the first region, using a first photomask, forming a second transfer pattern over the photoresist layer on the second region, using the first photomask, forming a mask pattern on the first mold structure, using the first transfer pattern and the second transfer pattern and forming a first trench and a second trench in the first mold structure, using the mask pattern, the first trench being formed in the first region, and the second trench being formed in the second region.

In one embodiment, a method of manufacturing an interposer comprises providing a substrate including a first region, and a second region adjacent to the first region, forming a first mold structure on the substrate, forming a photoresist layer on the first mold structure, forming a first transfer pattern over the photoresist layer on the first region, using a first photomask, forming a second transfer pattern over the photoresist layer on the second region, using the first photomask, forming a mask pattern including a plurality of openings on the first mold structure, using the first transfer pattern and the second transfer pattern, forming a lower electrode in the first mold structure corresponding to the openings, forming an upper electrode on the lower electrode and forming a dielectric layer between the upper electrode and the lower electrode.

In one embodiment, a method of manufacturing an interposer comprises providing a substrate including a first region, and a second region adjacent to the first region, forming a first mold structure on the substrate, forming a first photoresist layer on the first mold structure, forming a first transfer pattern over the first photoresist layer on the first region, using a first photomask, forming a second transfer pattern over the first photoresist layer on the second region, using the first photomask, forming a first mask pattern on the first mold structure, using the first transfer pattern and the second transfer pattern, forming a first trench and a second trench in the first mold structure, using the first mask pattern, forming a lower electrode which covers an inner wall of the first trench and an inner wall of the second trench, forming an upper electrode on the lower electrode, forming a dielectric layer which covers the lower electrode, between the lower electrode and the upper electrode, forming a first interlayer insulating layer on the upper electrode, forming a second photoresist layer on the first interlayer insulating layer, forming a third transfer pattern on the second photoresist layer, using a second photomask, forming a second mask pattern disposed between the first interlayer insulating layer and the second photoresist layer, using the third transfer pattern, forming a fourth transfer pattern on the second photoresist layer, using a third photomask; and forming a third mask pattern disposed between the first interlayer insulating layer and the second photoresist layer, using the fourth transfer pattern, a wiring layer being formed on the first interlayer insulating layer.

However, aspects of the inventive concepts are not restricted to the one set forth herein. The above and other aspects of the inventive concepts will become more apparent to one of ordinary skill in the art to which the inventive concepts pertains by referencing the detailed description of the inventive concepts given below.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION OF THE EMBODIMENTS

FIGS. 1 to 11 are diagrams for explaining a method of manufacturing an ISC (Integrated stacked capacitor) according to some example embodiments.

Figure 1:
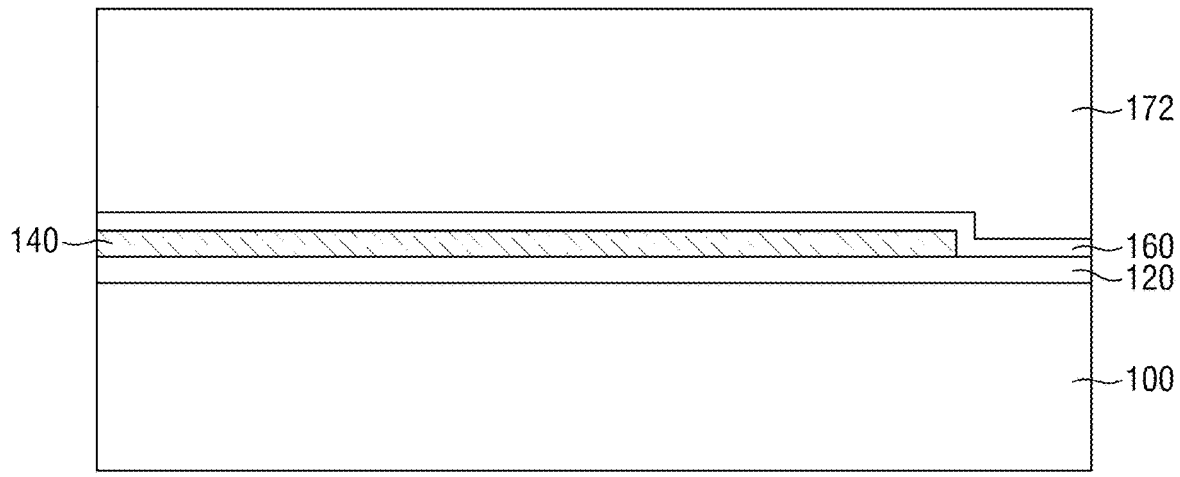
FIGS. 1 and 2 are diagrams for explaining a step of forming a molding structure on a substrate.
Figure 2:
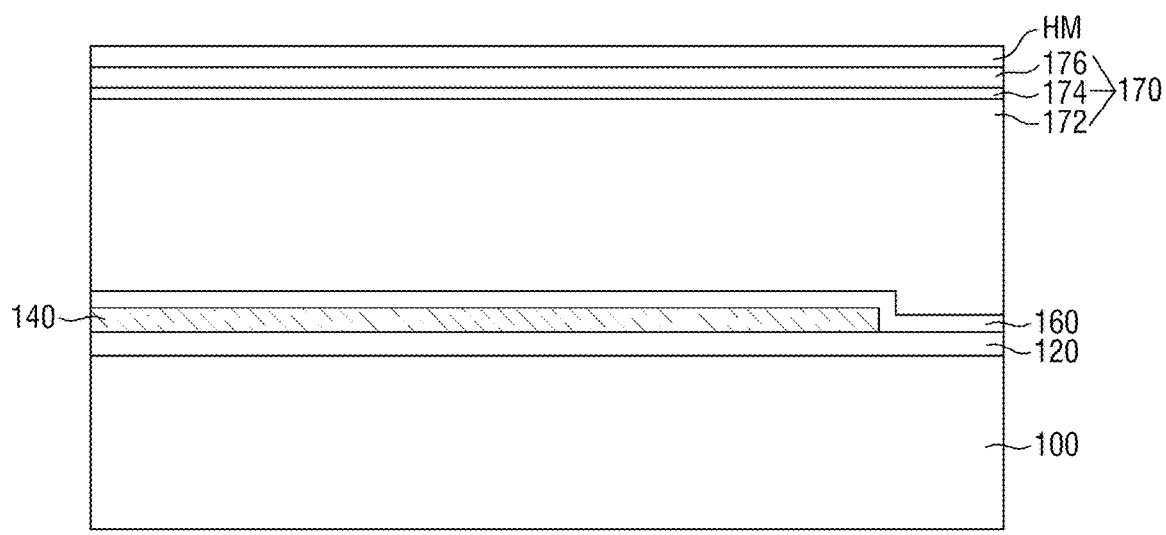

FIGS. 1 and 2 are diagrams for explaining a step of forming a molding structure on a substrate.

Referring to FIG. 1, a first interlayer insulating layer 120, a plate electrode 140, and an etching prevention layer 160 are sequentially deposited on a substrate 100, and a first sacrificial layer 172 may be deposited on the etching prevention layer 160.

The first interlayer insulating layer 120 may be disposed between the substrate 100 and the plate electrode 140.

The substrate 100 may be a silicon wafer including silicon (Si), for example, crystalline silicon (Si), polycrystalline silicon (Si), and/or amorphous silicon (Si).

The first interlayer insulating layer 120 may be formed conformally on the substrate 100. The first interlayer insulating layer 120 may include at least one of PDX (propylene oxide), USG (undoped silicate glass), SOG (spin on glass), PSG (phosphor silicate glass), BPSG (boro-phosphor silicate glass), FOX (flowable oxide), TOSZ (Tonen Silazane), TEOS (tetra ethyl ortho silicate), PE-TEOS (plasma enhanced-TEOS), and HDP-CVD (high density plasma-chemical vapor deposition) oxide. The first interlayer insulating layer 120 may be formed on the substrate 100, using a chemical vapor deposition (CVD) process, a plasma enhanced chemical vapor deposition (PECVD) process, a spin coating process, a high-density plasma-chemical vapor deposition (HDP-CVD) process or the like.

The plate electrode 140 may be made up of at least one of polysilicon, titanium nitride (TiN), ruthenium (Ru), platinum (Pt), iridium (Ir), osmium (Os), tungsten (W), molybdenum (Mo), cobalt (Co), nickel (Ni), gold (Au), silver (Ag), ruthenium oxide (RuO2), and iridium oxide (IrO2).

The plate electrode 140 may be formed, using a doped polysilicon, a metal, or the like through a chemical vapor deposition process, a physical vapor deposition process, an atomic layer deposition (ALD) process, or the like. Also, the planarization process may be performed through a chemical mechanical polishing (CMP) process and/or an etch back process.

As shown, although the plate electrode 140 is shown to be different from the width of the first interlayer insulating layer 120, it is not limited thereto.

The etching prevention layer 160 may be conformally formed on the plate electrode 140. The etching prevention layer 160 may be disposed on the plate electrode 140 to serve as an insulating layer. Specifically, it is possible to block the flow of the leakage current in the plate electrode 140. As a result, the etching prevention layer 160 is disposed above the plate electrode 140, and the first interlayer insulating layer 120 is disposed below the plate electrode 140, thereby effectively reducing preventing the leakage current from flowing.

A part of the etching prevention layer 160 may be disposed between the plate electrode 140 and the first sacrificial layer 172. Meanwhile, another part of the etching prevention layer 160 may be disposed between the first sacrificial layer 172 and the first interlayer insulating layer 120.

Also, the etching prevention layer 160 may be one of silicon oxynitride (SiON), silicon nitride (SiN) or silicon carbonitride (SiCN).

The first sacrificial layer 172 may have an etching selectivity as compared with the etching prevention layer 160 and the plate electrode 140. The first sacrificial layer 172 may be formed of, for example, an SOH (Spin on Hardmask) layer. The SOH layer may be a hydrocarbon-based insulating layer.

Referring to FIG. 2, a support structure layer 174 and a second sacrificial layer 176 may be sequentially disposed on the first sacrificial layer 172.

The molding structure 170 may include a first sacrificial layer 172, a second sacrificial layer 176, and a support structure layer 174 disposed between the first sacrificial layer 172 and the second sacrificial layer 176.

The support structure layer 174 may be one of silicon oxynitride (SiON), silicon nitride (SiN) or silicon carbonitride (SiCN), like the etching prevention layer 160.

The second sacrificial layer 176 may have an etching selectivity compared to the support structure layer 174, like the first sacrificial layer 172 described above. The second sacrificial layer 176 may be formed of, for example, an SOH (Spin on Hardmask) layer. The SOH layer may be a hydrocarbon-based insulating layer.

The hard mask HM may be disposed on the second sacrificial layer. As the size of the pattern to be formed decreases, a fine pattern with a good profile may be difficult to be formed using only a general lithography method. Therefore, a fine pattern may be formed by forming the hard mask HM between the material layer to be etched and the photoresist layer PR shown in FIG. 3A.

Therefore, the hard mask HM has chemical resistance, heat resistance and etching resistance to withstand various etching processes.

The hard mask HM may be a single layer of a conductive or insulating material such as a polysilicon layer, a tungsten layer and a nitride layer, or a multilayer layer in which a plurality of layers is stacked.

Figure 3A:
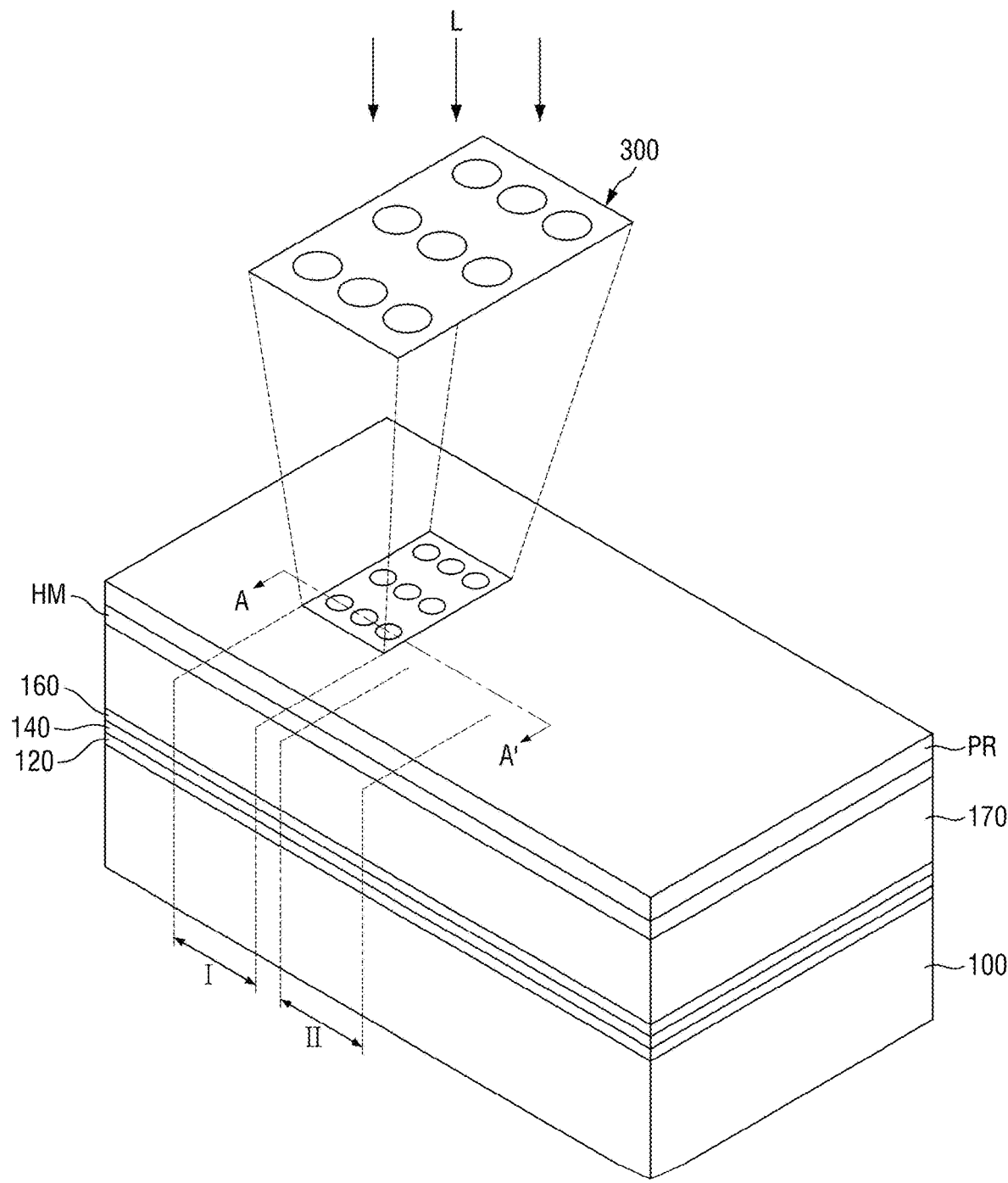
FIG. 3A is a perspective view for explaining a step of forming a transfer pattern on a photoresist layer on a first region.

FIG. 3A is a perspective view for explaining a step of forming a transfer pattern on a photoresist layer on a first region.

Figure 3B:
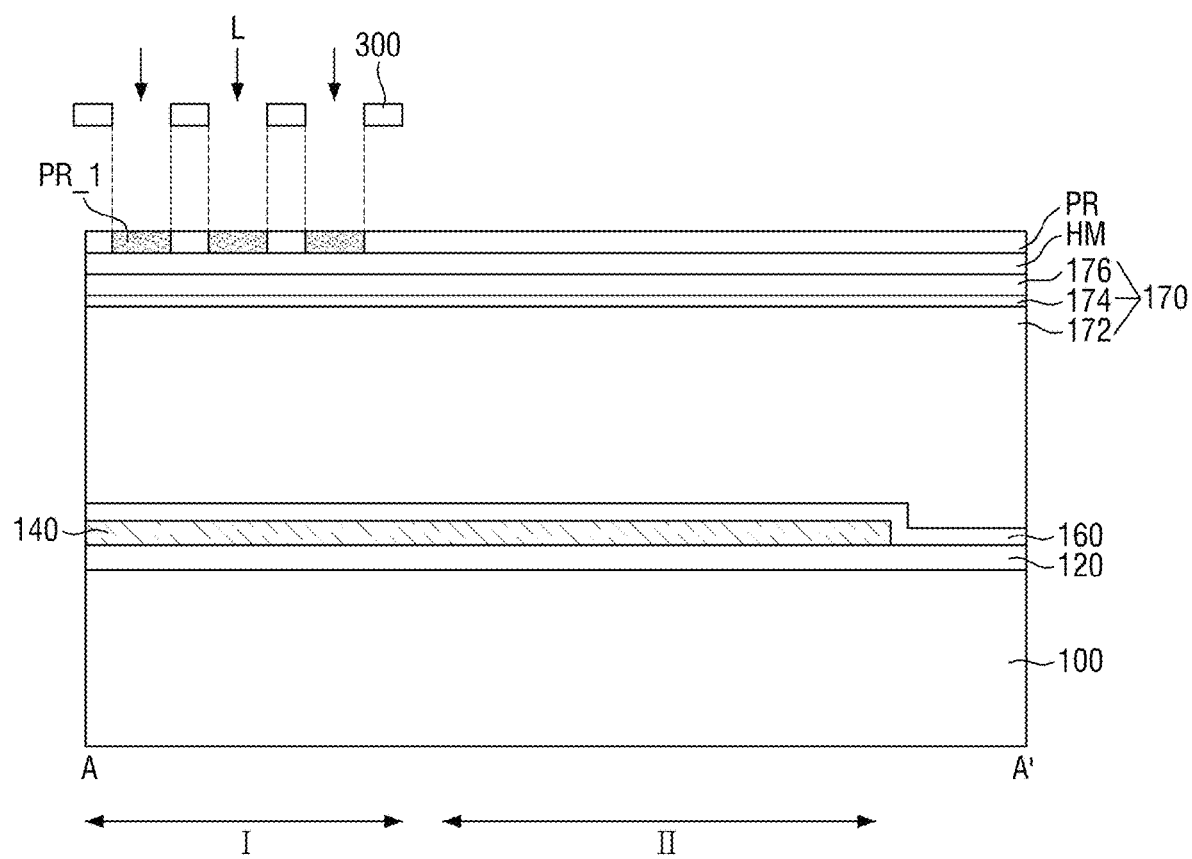
FIG. 3B is a cross-sectional view taken along a line A-A' of FIG. 3A.

FIG. 3B is a cross-sectional view taken along a line A-A' of FIG. 3A.

Referring to FIGS. 3A and 3B, the substrate 100 may include a first region I and a second region II. The second region II may be adjacent to the first region I and may not overlap the first region I.

Light L emitted from a light source may form a first transfer pattern PR_1 on the first region I over the photoresist layer PR, using the first photomask 300. The light L may be extreme ultraviolet, which is light having a very short wavelength. However, the example embodiments are not limited thereto.

The photoresist layer PR may include a resin made up of polymer bonds, a solvent that absorbs external light, and a PAC (Photo active compound) that transfers energy to the resin substantially in response to light.

As shown in FIG. 3B, the first transfer pattern PR_1 may change its chemical structure by absorbing the radiant energy of light L.

Figure 11:
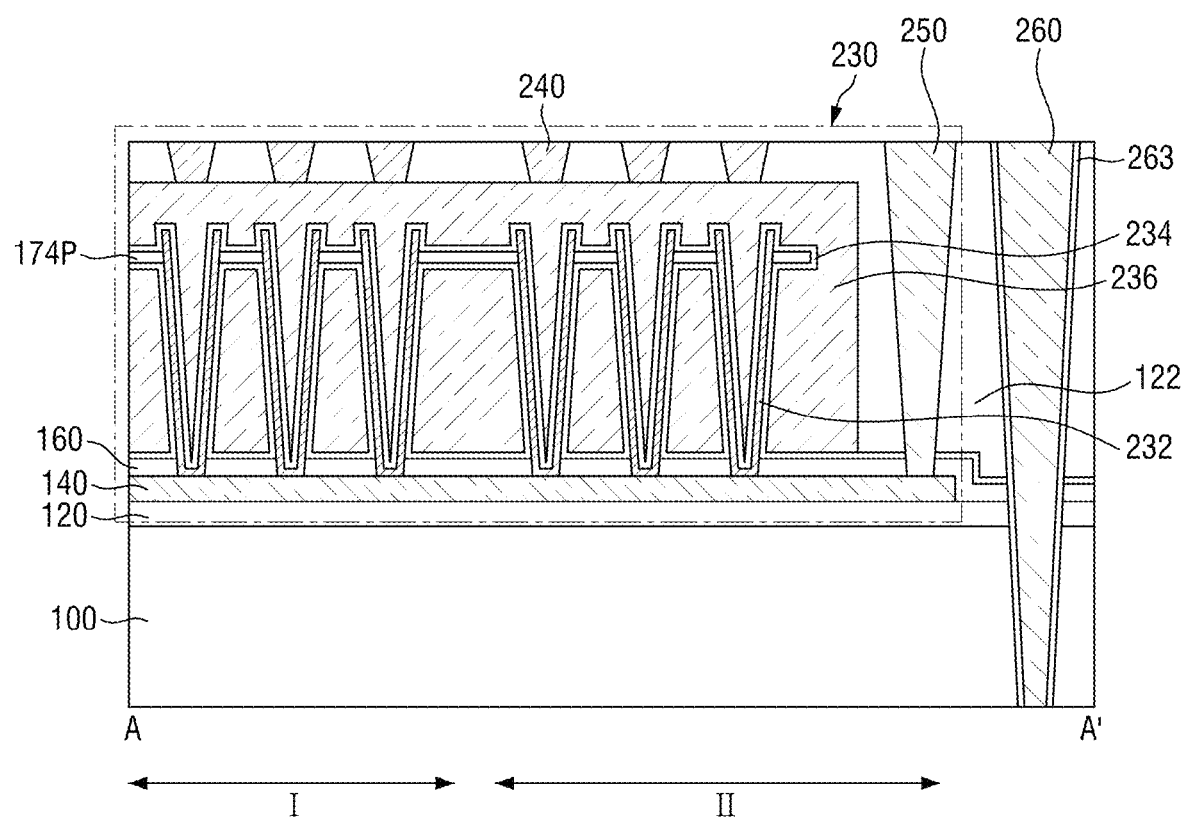
FIG. 11 is a view for explaining a step of forming a penetration via in the interlayer insulating layer after the upper electrode is formed.

The first photomask 300 may include a plurality of circular photomask patterns to form a repeated capacitor structure, for example, as shown in FIG. 11. However, the example embodiments are not limited thereto.

As the type of exposure, any one method of contact printing, proximity printing, and projection printing may be used.

Figure 4A:
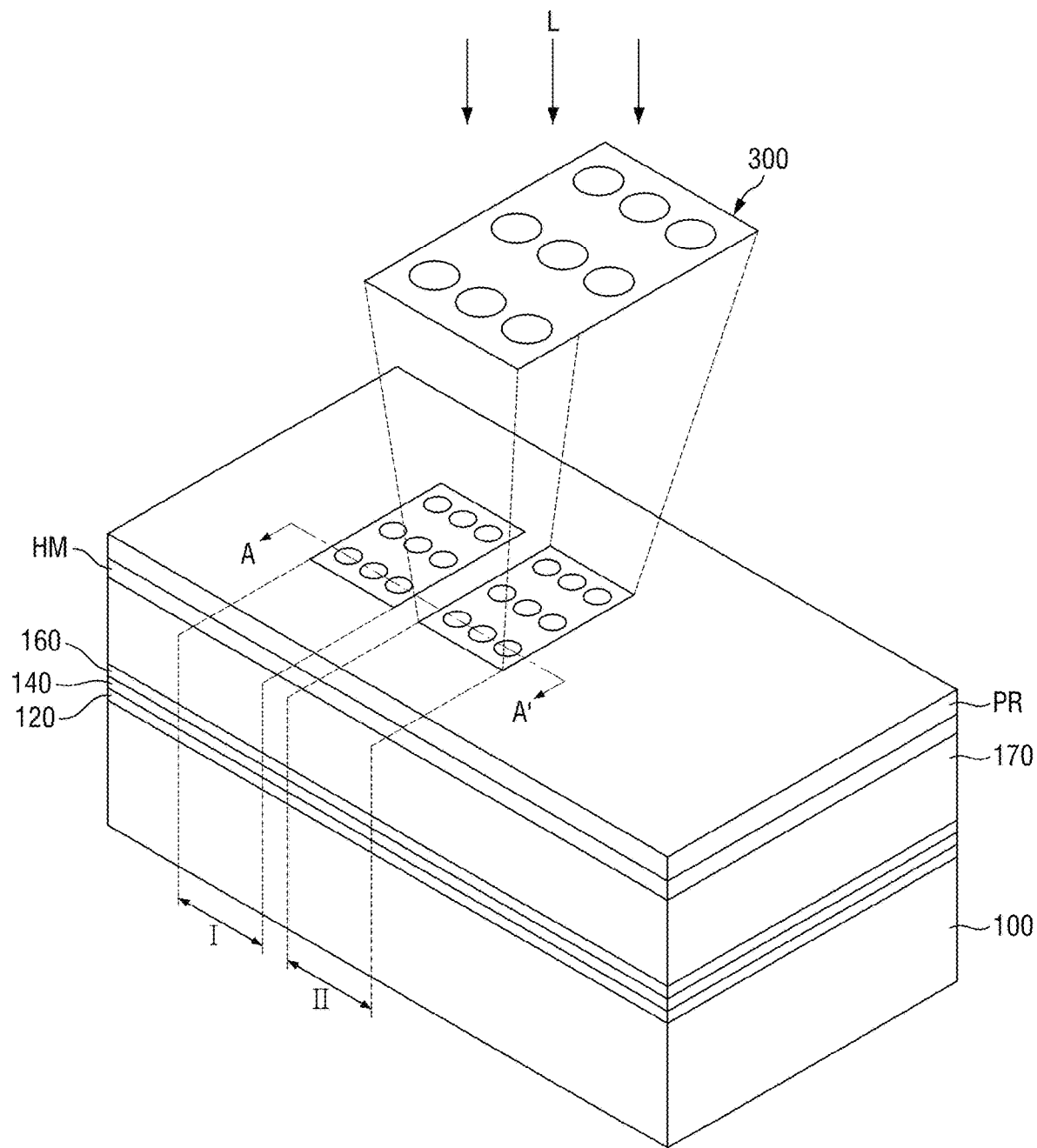
FIG. 4A is a perspective view showing a step of forming a transfer pattern on a photoresist layer over the second region.

FIG. 4A is a perspective view showing a step of forming a transfer pattern on a photoresist layer over the second region.

Figure 4B:
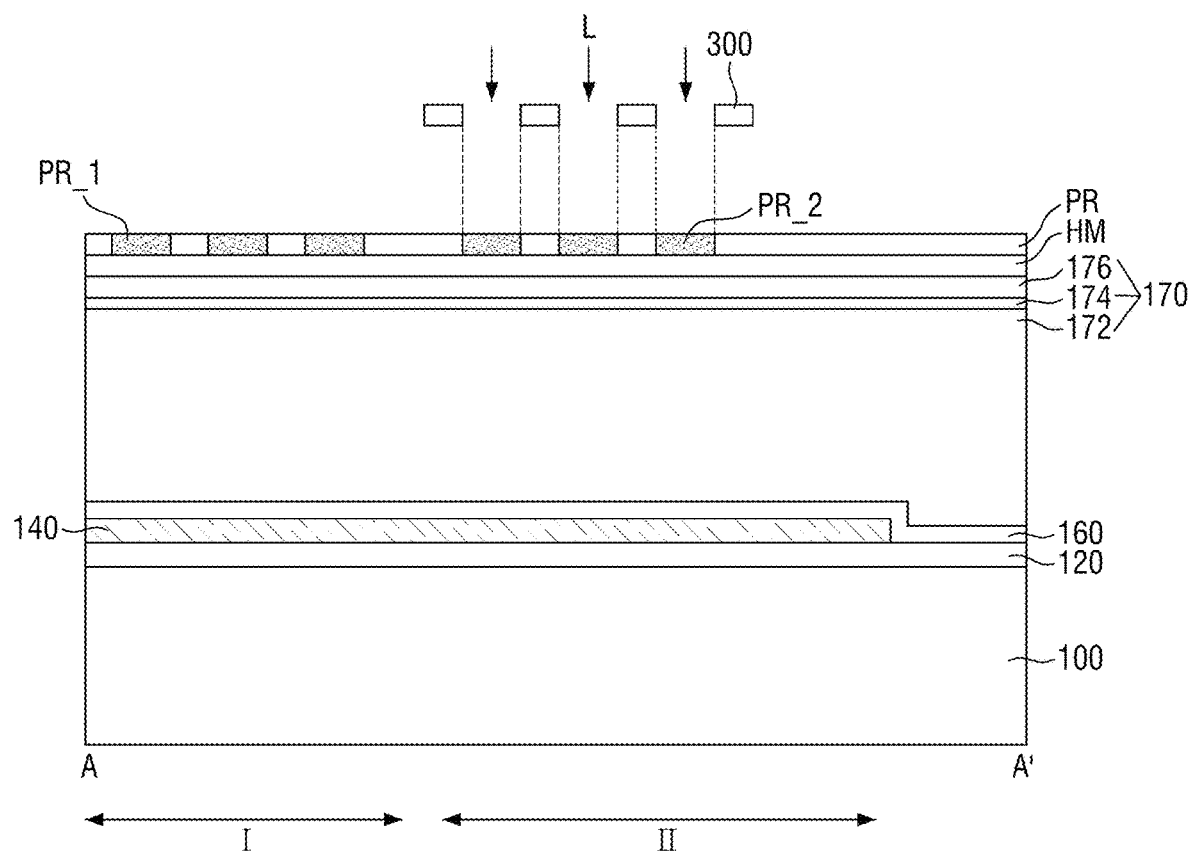
FIG. 4B is a cross-sectional view taken along a line A-A' of FIG. 4A.

FIG. 4B is a cross-sectional view taken along a line A-A' of FIG. 4A.

Referring to FIGS. 4A and 4B, the light L emitted from the light source may form a second transfer pattern PR_2 on the photosensitive layer over the second region II, using the first photomask 300.

When forming the first transfer pattern PR_1 on the photoresist layer PR over the first region I and forming the second transfer pattern PR_2 on the photoresist layer PR over the second region II, the photomask 300 may be used. The photomask 300 may be used because the capacitor structure 230, as shown in FIG. 11, is a repeated monomer.

That is, a large-sized interposer may use two or more different photomasks, and uses a stitched reticle for alignment, and meanwhile, since the capacitor structure 230 as shown in FIG. 11 is a repeated small structure, the same photomask may be used.

By using one photomask for the repeated capacitor structure, the process not only simplifies, but also the number of photomasks can be effectively reduced in the photo process, which consumes a lot of time and money. However, the example embodiments are not limited thereto.

As a result, although 2 shots/dies have been performed using different photomasks to form a capacitor in the related art, 1 shot/die may be performed in the example embodiments as described above.

Figure 5:
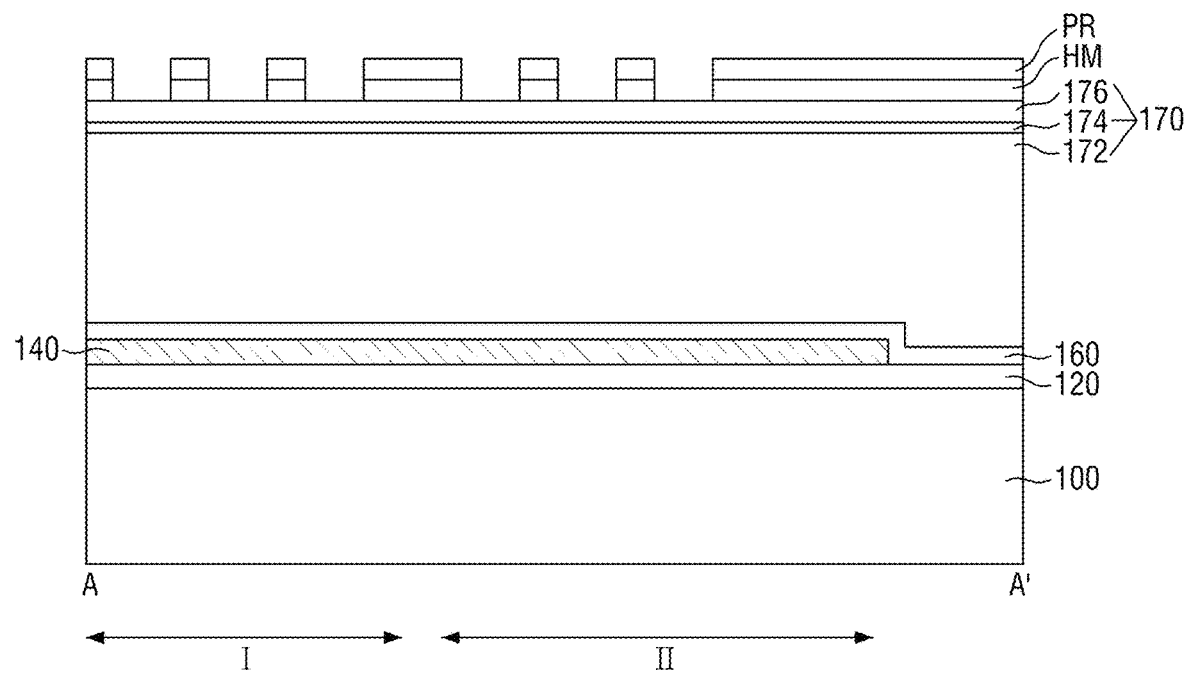
FIG. 5 is a diagram for explaining a step of forming a mask pattern using a transfer pattern.

FIG. 5 is a diagram for explaining a step of forming a mask pattern using a transfer pattern.

Referring to FIG. 4B and FIG. 5, a developing step may be performed by supplying a developing solution to the exposed first transfer pattern PR_1 and the second transfer pattern PR_2.

At the developing step, the first transfer pattern PR_1 and the second transfer pattern PR_2 may be removed through an ashing process or a stripping process.

The ashing process may be largely divided into a dry process and a wet process, and the dry ashing process may use a method using oxygen plasma discharge, a method using ozone, a method using an excimer lamp, or the like.

On the other hand, a solution having a strong oxidizing action, for example, a mixed solution of sulfuric acid and hydrogen peroxide, may be used for the purpose of removing photoresist layer PR in the wet ashing process.

The hard mask HM may be formed in the same pattern as the photoresist layer PR, using the removed first transfer pattern PR_1 and the second transfer pattern PR_2 as an etching mask.

Figure 6:
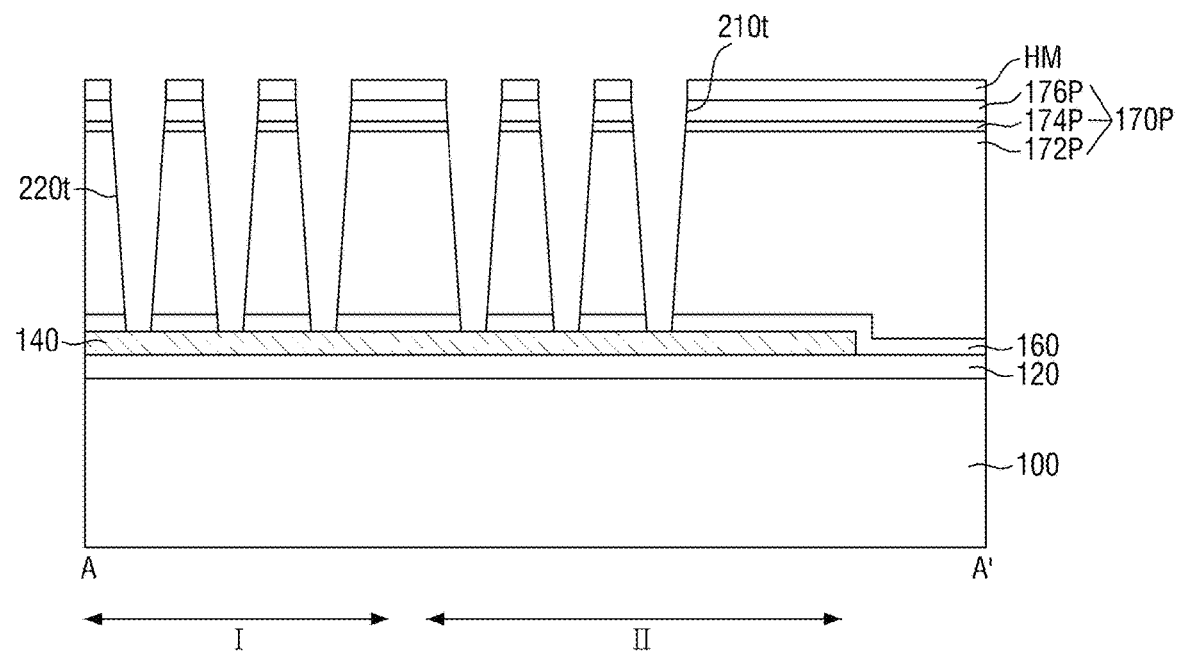
FIG. 6 is a diagram for explaining a step of forming the trench in the molding structure.
Figure 7:
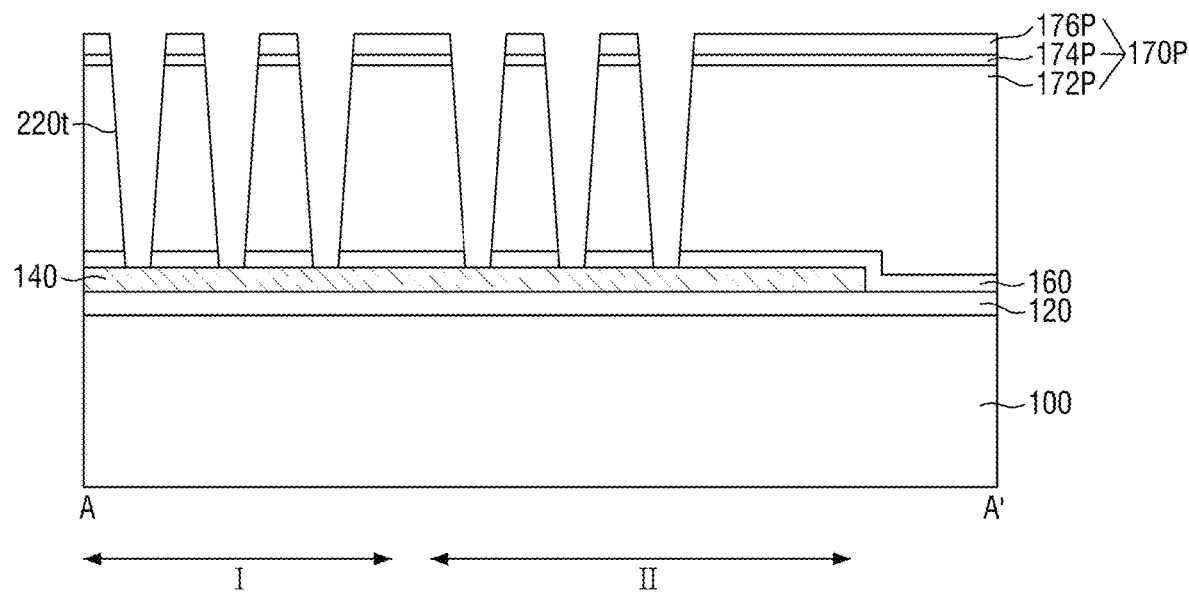
FIG. 7 is a diagram for showing a step of status that hard mask is removed.

FIGS. 6 and 7 are diagrams for explaining a step of forming a trench in the mold structure.

Referring to FIGS. 6 and 7, the mold structure 170 and the etching prevention layer 160 may be etched using the left hard mask HM as an etching mask, thereby forming a first trench 220t on the first region I and a second trench 210t on the second region II.

As the first trench 220t and the second trench 210t are formed, the patterning mold structure 170P may include a patterning first sacrificial layer 172P, a patterning second sacrificial layer 176P and a support structure 174P.

Although the first trench 220t and the second trench 210t are shown to have an inclined surface, the example embodiments are not limited thereto.

The above-described etching process may use any one method of an isotropic etching and an anisotropic etching. The isotropic etching is etching that proceeds faster in a specific direction, and basically includes wet etching and barrel plasma etching. A RIE (reactive ion etching) may be used as the anisotropic etching. For example, the etchant is ionized in the process chamber and is electrically accelerated, and may perform etching mainly in a direction of the electric field. In the dry etching, a plasma may be normally formed to activate the etchant.

For example, the mold structure 170 and the etching prevention layer 160 may be etched, using a mixed gas made up of sulfur hexafluoride ($SF_6$), chlorine ($Cl_2$) and nitrogen ($N_2$), or a mixed gas of chlorine and hydrogen bromide (HBr), both of which may be used in the plasma dry etching method.

As the first and second trenches 220t and 210t are formed in the mold structure 170, the mold structure 170 may include a patterning first sacrificial layer 172P, a patterning second sacrificial layer and a support structure 174P.

As shown, the support structure 174P may correspond to a part of the support structure layer 174, and may be placed between the patterning first sacrificial layer 172P and the patterning second sacrificial layer 176P.

As shown in FIGS. 6 and 7, after the mold structure 170 and the etching prevention layer 160 are etched, the hard mask HM may be removed.

FIGS. 8 to 11 are diagrams for explaining a step of forming an upper electrode and a lower electrode, forming a dielectric layer between them, and forming a capacitor structure.

Figure 8:
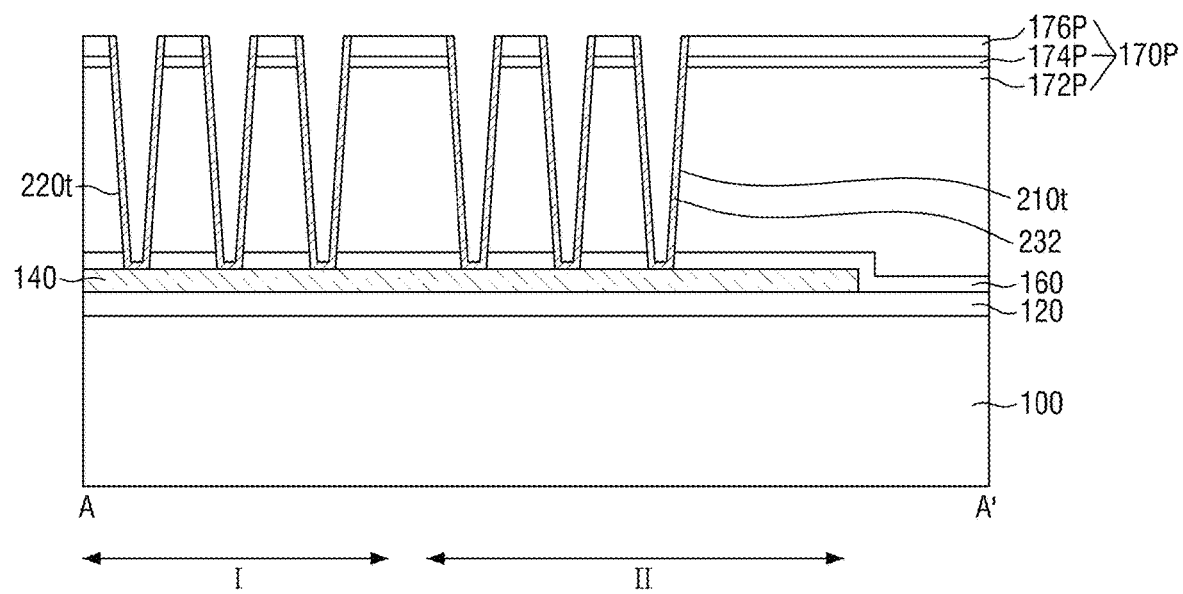
FIG. 8 is a diagram for explaining a step of forming a lower electrode which covers the inner wall of the trench.

FIG. 8 is a diagram for explaining a step of forming a lower electrode which covers the inner wall of the trench.

Referring to FIG. 8, the lower electrode 232 may also cover the upper surface of the patterning second sacrificial layer 176P, including the inner wall of the first trench 220t and the inner wall of the second trench 210t.

The lower electrode 232 may use a layer-forming technique with excellent property of step coverage, such as chemical vapor deposition (CVD), physical vapor deposition (PVD) and/or atomic layer deposition (ALD).

The lower electrode 232 on the upper surface of the patterning second sacrificial layer 176P may be planarized through a metal CMP (chemical mechanical polishing) process or the like, until the upper surface of the patterning second sacrificial layer 176P is exposed.

The lower electrode 232 may include at least one of silicon doped with impurities, metal materials, metal nitride layers, and a metal silicide. For example, the lower electrode 232 may be formed of a high melting point metal layer such as cobalt, titanium, nickel, tungsten, and/or molybdenum. Specifically, the lower electrode 232 may be formed of a metal nitride layer such as a titanium nitride layer (TiN), a titanium silicon nitride layer (TiSiN), a titanium aluminum nitride layer (TiAlN), a tantalum nitride layer (TaN), a tantalum silicon nitride layer (TaSiN), a tantalum aluminum nitride layer (TaAlN) and/or a tungsten nitride layer (WN).

Further, the lower electrode 232 may be formed of at least one noble metal layer selected from the group consisting of platinum (Pt), ruthenium (Ru), and iridium (Ir). The lower electrode 232 may also be formed of a noble metal conductive oxide layer such as PtO, RuO$_2$ or IrO$_2$, and a conductive oxide layer such as SRO (SrRuO$_3$), BSRO ((Ba,Sr)RuO$_3$), CRO(CaRuO$_3$) and/or LSCo.

Meanwhile, after the lower electrode 232 is formed, a plasma treatment and heat treatment process for removing impurities generated at the time of vapor-deposition of the lower conductive layer may be performed. N$_2$ and/or H$_2$ plasmas may be used during the plasma treatment process.

Consequentially, since the first trench 220t on the first region I is in contact with the plate electrode 140 on the first region I, the lower electrode 232 may touch the plate electrode 140 at the lower part of the first trench 220t.

Similarly, since the second trench 210t on the second region II is in contact with the plate electrode 140 on the second region II, the lower electrode 232 may touch the plate electrode 140 at the lower part of the second trench 210t.

Figure 9:
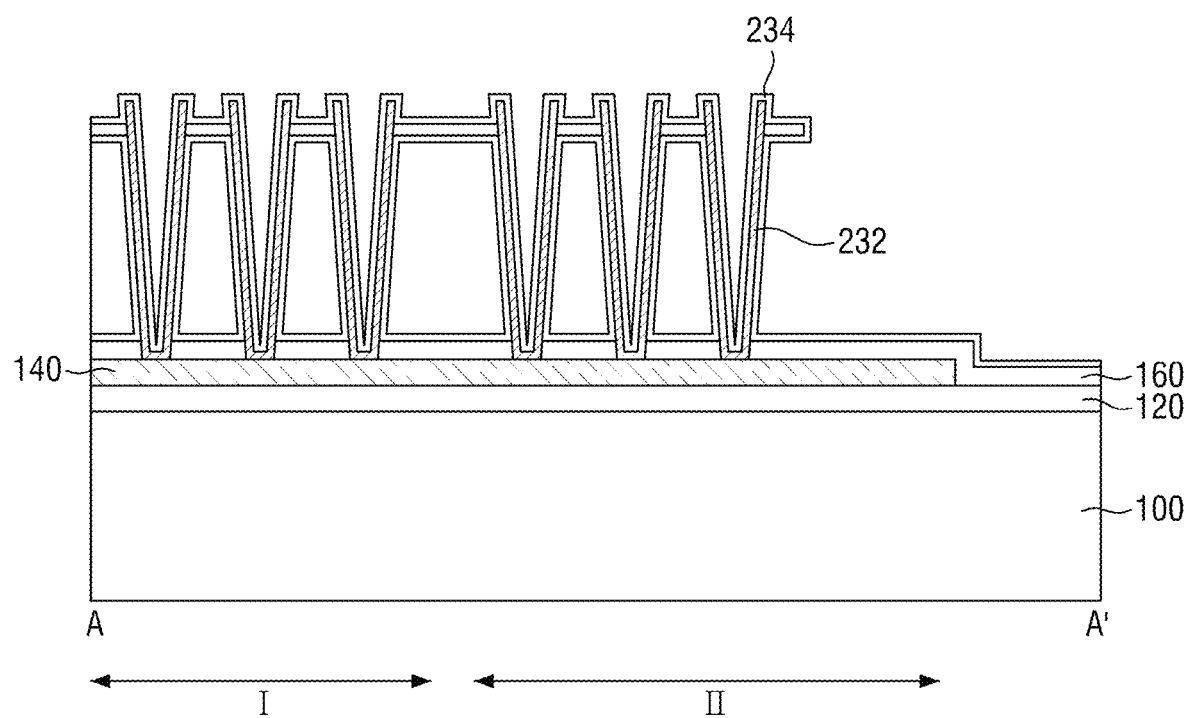
FIG. 9 is a diagram showing a stage in which a dielectric layer is formed on the lower electrode.

FIG. 9 is a diagram showing a stage in which a dielectric layer is formed on the lower electrode.

Referring to FIGS. 8 and 9, the patterning first sacrificial layer 172P and the patterning second sacrificial layer 176P may be simultaneously or sequentially removed.

The patterning first sacrificial layer 172P and the patterning second sacrificial layer 176P on the first region I and the second region II may be removed through an etching process.

The patterning mold structure 170P on the remaining portion except the first region I and the second region II may be removed in another etching process.

After the aforementioned etching processes are performed, the dielectric layer 234 may be formed conformally along the surface of the etching prevention layer 160, including the surfaces of the lower electrodes 232 and the surface of the support structure 174p.

The dielectric layer 234 may include at least one of silicon oxide (SiO$_2$), silicon nitride (SiN), silicon oxynitride (SiON), tantalum oxide (Ta$_2$O$_5$), hafnium oxide (HfO$_2$), aluminum oxide (Al$_2$O$_3$), barium-strontium titanite [(Ba,Sr)TiO$_3$] or lead-zirconium titanite [(Ba,Sr)TiO$_3$]. However, the example embodiments are not limited or restricted thereto.

Figure 10:
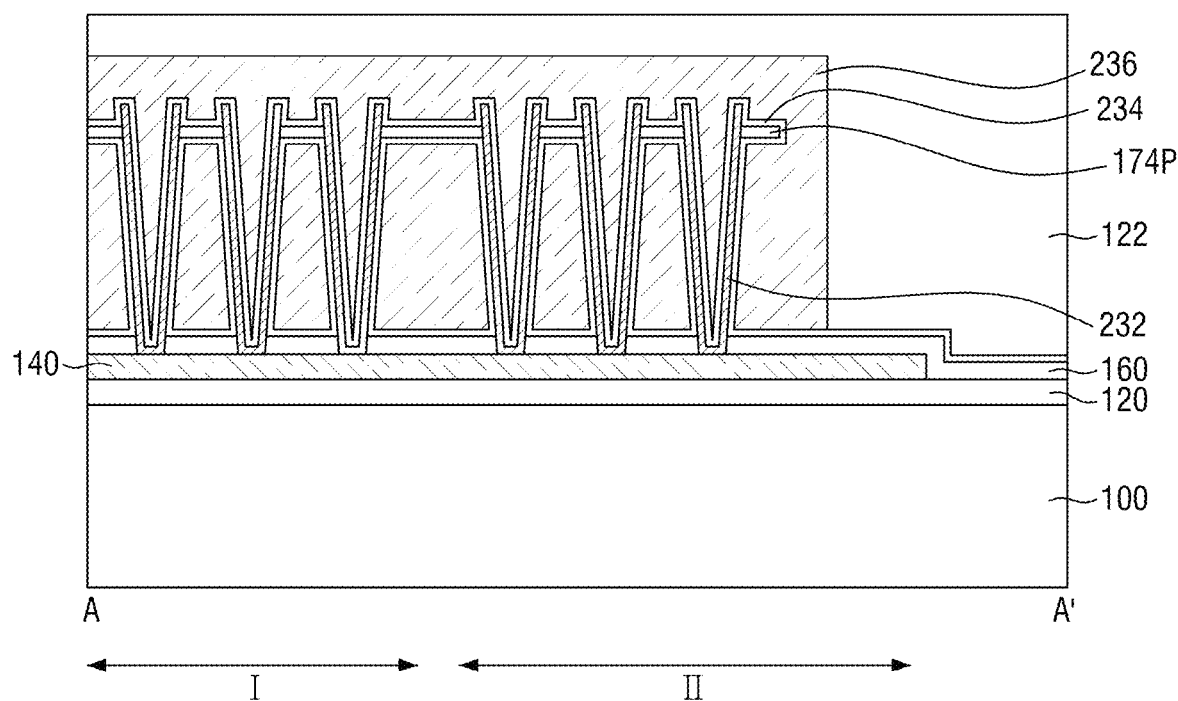
FIG. 10 is a diagram for explaining a step in which the upper electrode is formed after the dielectric layer is formed.

FIG. 10 is a diagram for explaining a step in which the upper electrode is formed after the dielectric layer is formed.

FIG. 11 is a view for explaining a step of forming a penetration via in the interlayer insulating layer after the upper electrode is formed.

Referring to FIGS. 10 and 11, the upper electrode 236 may cover the upper dielectric layer 234 on the first region and on the second region II. Specifically, since the upper electrode 236 covers the dielectric layer 234, the dielectric layer 234 may be disposed between the upper electrode 236 and the lower electrode 232.

The upper electrode 236 may use a layer-formation technique with excellent property of step coverage, such as a chemical vapor deposition (CVD), a physical vapor deposition (PVD) or an atomic layer deposition (ALD).

Further, the upper electrode 236 may be a single layer or a multilayer layer in which a plurality of layers is stacked.

The upper electrode 236 may include at least one of silicon doped with an impurity, metal materials, metal nitride layers, and metal silicide. For example, the upper electrode 236 may be formed of a high melting point metal layer such as cobalt, titanium, nickel, tungsten, and/or molybdenum. The upper electrode 236 may be formed of a metal nitride layer such as titanium nitride layer (TiN), titanium silicon nitride layer (TiSiN), titanium aluminum nitride layer (TiAlN), tantalum nitride layer (TaN), tantalum silicon nitride layer (TaSiN), tantalum aluminum nitride layer (TaAlN) and/or tungsten nitride layer (WN). Further, the upper electrode 236 may be formed of at least one noble metal layer selected from the group consisting of platinum (Pt), ruthenium (Ru), and/or iridium (Ir). Also, the upper electrode 236 may be formed of a noble metal conductive layer such as PtO, RuO$_2$ or IrO$_2$, and a conductive oxide layer such as SRO(SrRuO$_3$), BSRO((Ba,Sr)RuO$_3$), CRO (CaRuO$_3$), and/or LSCo.

The dielectric layer 234 may serve to reduce or prevent electric charges from passing between the upper electrode 236 and the lower electrode 232. The dielectric layer 234 does not allow some to all electric charges to pass, but may allow electrification by the voltage difference between the upper electrode 236 and the lower electrode 232.

The upper electrode 236, the lower electrode 232, and the dielectric layer 234 may include a part of the capacitor structure 230. That is, each of the upper electrode 236 and the lower electrode 232 serve as separated electrodes, and the dielectric layer 234 is a dielectric material between the upper electrode 236 and the lower electrode 232 to allow each electrode to charge the electric charges.

The second interlayer insulating layer 122 may be formed along the surface of the upper electrode 236 after the formation of the upper electrode 236. Specifically, the second interlayer insulating layer 122 may also be formed on the dielectric layer 234 disposed on the remaining regions other than the first region I and the second region II.

The second interlayer insulating layer 122 may include at least one of PDX (propylene oxide), USG (undoped silicate glass), SOG (spin on glass), PSG (phosphor silicate glass), BPSG (boro-phosphor silicate glass), FOX (flowable oxide), TOSZ (Tonen Silazane), TEOS (tetra ethyl ortho silicate), PE-TEOS (plasma enhanced-TEOS), HDP-CVD (high density plasma-chemical vapor deposition) oxide.

As shown in FIG. 11, the capacitor structure 230 may include an upper electrode 236, a lower electrode 232, a dielectric layer 234 disposed between them, and a plurality of electrode connection penetration vias penetrating the second interlayer insulating layer 122.

The capacitor structure 230 may be located inside an interposer, and the interposer may not include electron tubes including a transistor or a power supply as a component of an electric circuit having the ability capable of generating electrical energy.

The first electrode connection penetration via 240 penetrates the second interlayer insulating layer 122 and may be disposed on the upper electrode 236. Specifically, the first electrode connection penetration via 240 may be electrically connected to the upper electrode 236.

As shown, the first electrode connection penetration via 240 is shown as six vias having inclined surfaces on the upper electrode 236, but is not limited thereto.

The second electrode connection penetration via 250 penetrates the second interlayer insulating layer 122, the dielectric layer 234 and the etching prevention layer 160 and may be electrically connected to the plate electrode 140, on the remaining region other than the first region I and the second region II.

As shown, although the second electrode connection penetration via 250 is shown as a single via having an inclined surface on the side surface of the upper electrode 236, the example embodiments are not limited thereto.

Although it is not shown, the first electrode connection penetration via 240 and the second electrode connection penetration via 250 may include a via conductive pattern and a via barrier pattern.

The via conductive pattern may be formed of a Cu material, and the via barrier pattern may be formed of any one of Ta, TaN, Ru, Co, Mn, TiN, Ti/TiN, WN, Ni, NiB, or a combination thereof.

The first electrode connection penetration via 240 and the second electrode connection penetration via 250 may be formed by penetrating in the thickness direction of the second interlayer insulating layer 122 using a method such as laser processing or reactive ion etching to form a plurality of via holes and then filling a conductive material.

The first electrode connection penetration via 240 and the second electrode connection penetration via 250 may be formed simultaneously or in separate processes.

The substrate penetration via 260 is disposed on a side surface of the capacitor structure 230, penetrates the second interlayer insulating layer 122, and may extend into the substrate 100.

The substrate penetration via insulating layer 263 may be placed on both side walls of the substrate penetration via 260 to reduce or prevent an electrical short between the substrate 100 and the substrate penetration via 260, which is a conductive material.

The substrate penetration via insulating layer 263 penetrates the second interlayer insulating layer 122, and may extend into the substrate 100 in a direction in which the substrate penetration via 260 extends.

The substrate penetration via insulating layer 263 may include at least one of PDX (propylene oxide), USG (undoped silicate glass), SOG (spin on glass), PSG (phosphor silicate glass), BPSG (boro-phosphor silicate glass), FOX (flowable oxide), TOSZ (Tonen Silazane), TEOS (tetra ethyl ortho silicate), PE-TEOS (plasma enhanced-TEOS), and HDP-CVD (high density plasma-chemical vapor deposition) oxide.

Also, the substrate penetration via 260 may proceed at a step separate from the formation of the first electrode connection penetration via 240 and the second electrode connection penetration via 250.

Figure 12:
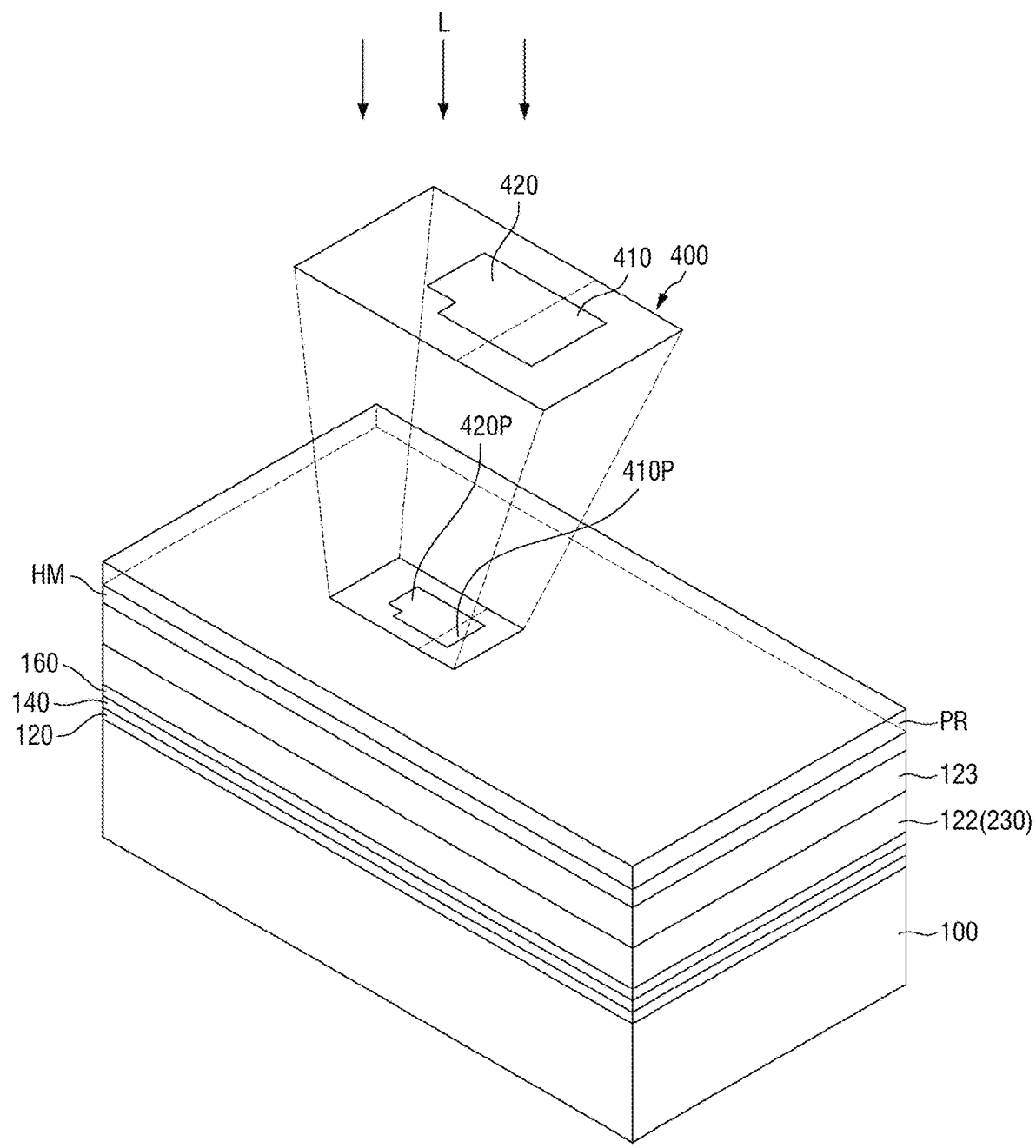
FIGS. 12 and 13 are perspective views for explaining a photo-lithographic process for forming an interposer wiring layer.
Figure 13:
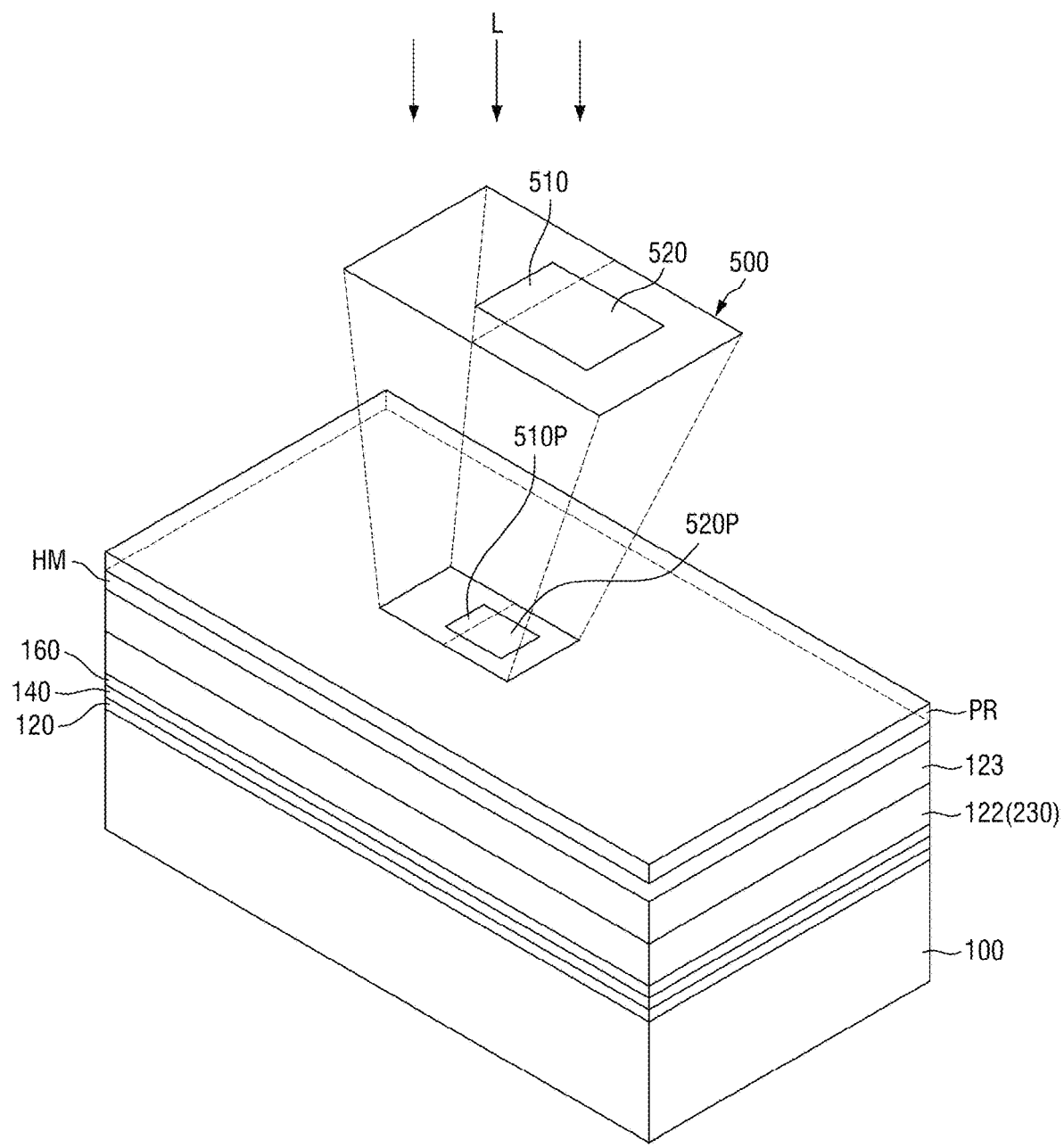

FIGS. 12 and 13 are perspective views for explaining a photo-lithographic process for forming an interposer wiring layer.

Figure 14:
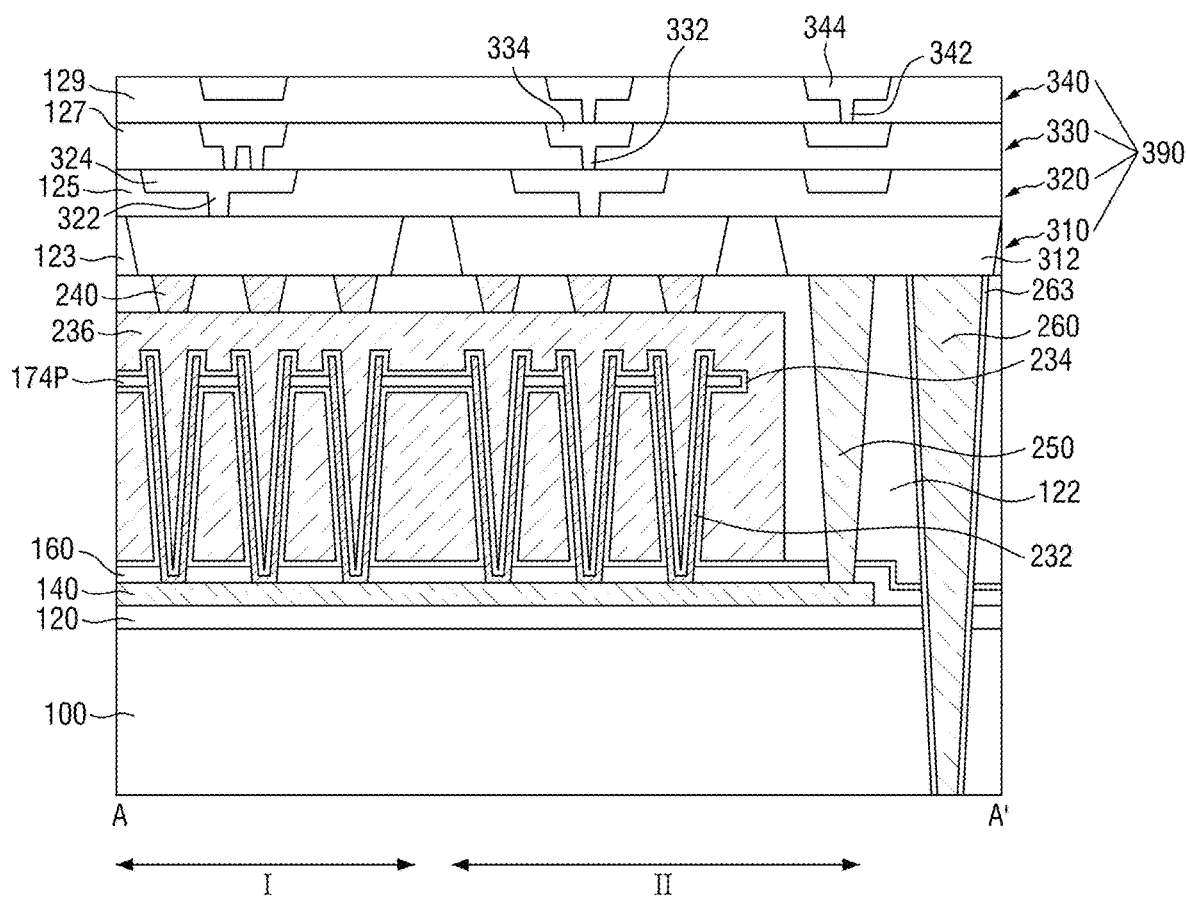
FIG. 14 is a diagram showing an interposer according to some example embodiments.

FIG. 14 is a diagram showing an interposer according to some example embodiments.

Repeated parts of the above-described parts will be briefly described or omitted.

Referring to FIGS. 11 to 14, the interposer may include a capacitor structure 230 and a wiring composite structure 390.

After the second interlayer insulating layer 122 is formed and the plurality of electrode connection penetration vias and the substrate penetration via 260 are formed, the wiring composite structure 390 may be formed on the second interlayer insulating layer 122.

On the substrate 100, the second interlayer insulating layer 122 surrounding the capacitor structure 230, and the wiring composite structure 390 disposed on the second interlayer insulating layer 122 may not include electron tubes including a transistor and a power supply, which are components of electrical circuits having the ability capable of generating the electric energy.

Unlike the capacitor structure 230, since the wiring composite structure 390 is not a repeated structure and is larger in size than the capacitor, the wiring composite structure 390 may need to use a plurality of photomasks that shares various stitching mark patterns.

As shown in FIGS. 12 and 13, the second photomask 400 may include a first wiring mark 420 and a first stitching mark 410.

Meanwhile, the third photomask 500 may include a second wiring mark 520 and a second stitching mark 510.

When one die is formed using a photo process, the number of photomasks used may be 2 shots/die or the number of shots per die may be greater than 2.

Referring to FIGS. 12 to 14, the third interlayer insulating layer 123 may be formed on the second interlayer insulating layer after formation of a plurality of penetration vias penetrating the second interlayer insulating layer 122. Fourth to sixth interlayer insulating layers 125, 127 and 129 may be sequentially formed on the third interlayer insulating layer 123.

Like the first and second interlayer insulating layers 120 and 122, the third to sixth interlayer insulating layers 123, 125, 127 and 129 may include at least one of PDX (propylene oxide), USG (undoped silicate glass), SOG (spin on glass), PSG (phosphor silicate glass), BPSG (boro-phosphor silicate glass), FOX (flowable oxide), TOSZ (Tonen Silazane), TEOS (tetra ethyl ortho silicate), PE-TEOS (plasma enhanced-TEOS), and HDP-CVD (high density plasma-chemical vapor deposition) oxide.

In order to form the first wiring layer 310, a hard mask HM and a photoresist layer PR may be sequentially stacked on the third interlayer insulating layer 123.

The light L emitted from the light source patterns the photoresist layer PR using the second photomask 400, and may pattern the hard mask HM disposed between the third interlayer insulating layer 123 and the photoresist layer PR.

The photoresist layer PR may include a first wiring pattern 420P and a first stitching pattern 410P, using the second photomask 400.

The light L emitted from the light source patterns the photoresist layer PR using a third photomask 500, and may pattern the hard mask HM disposed between the third interlayer insulating layer 123 and the photoresist layer PR.

The photoresist layer PR may include a second wiring pattern 520P and a second stitching pattern 510P, using the third photomask 500.

The first stitching pattern 410P and the second stitching pattern 510P may be the same region in the photoresist layer.

Referring to FIGS. 4A and 12 to 14, when forming the capacitor structure 230 inside the interposer, which is a repeated structure with no active element such as a transistor, the first photomask 300 may be used. On the other hand, when forming a large-sized wiring composite structure 390 with no repeated structure, two or more photomasks may be used.

Referring to FIG. 14, the wiring composite structure 390 may include first to fourth wiring layers 310, 320, 330 and 340, and the first to fourth wiring layers 310, 320, 330 and 340 may include the first to fourth wirings 312, 324, 334 and 344 and the second to fourth penetration wirings 322, 332 and 342, and the third to sixth interlayer insulating layers 123, 125, 127 and 129.

In some example embodiments, the second wiring 324 and the second penetration wiring 322 of the second wiring layer 320 may be formed via a dual damascene process.

Similarly, the third wiring 334 and the third penetration wiring 332 of the third wiring layer 330, and the fourth wiring 344 and the fourth penetration wiring 342 of the fourth wiring layer 340 may also be formed via a dual damascene process.

Although not shown, in the dual damascene process, a diffusion prevention layer may be deposited at a boundary between each wiring, each penetration wiring, and each interlayer insulating layer. After the diffusion barrier layer is deposited, each wiring may be formed via a CMP process after a material such as copper is electroplated. This is to reduce or prevent the copper material from diffusing into each interlayer insulating layer.

Figure 15:
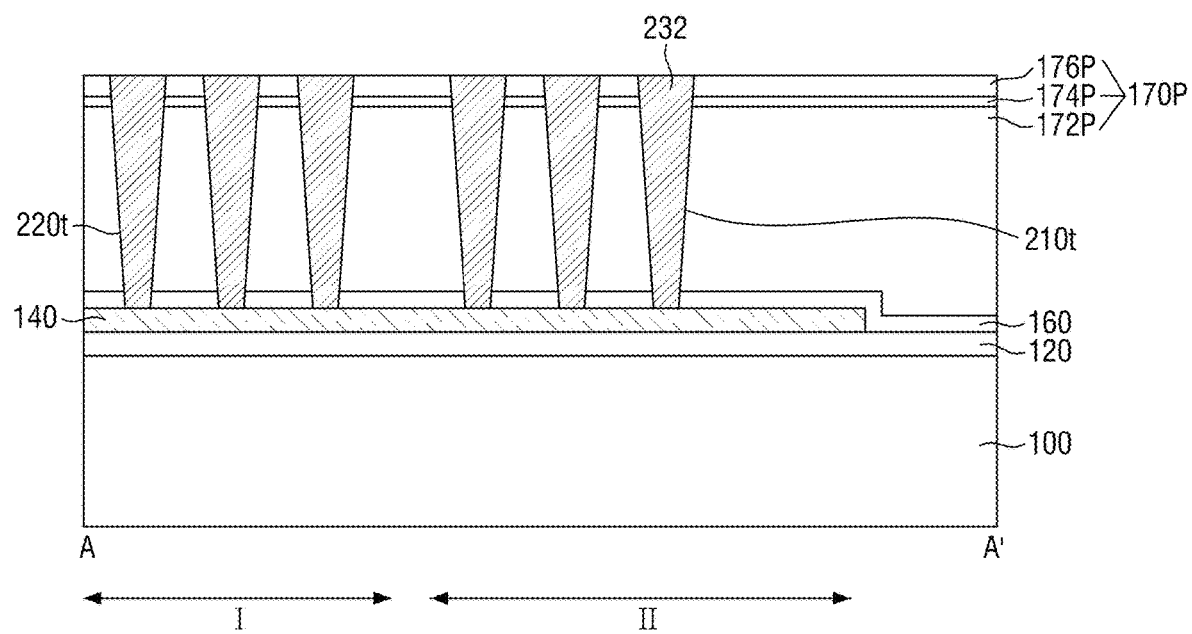
FIG. 15 is another example of FIG. 8 and a diagram for explaining a step of forming a lower electrode in a trench.

FIG. 15 is another example of FIG. 8 and a diagram for explaining a step of forming a lower electrode in a trench.

Referring to FIG. 15, a lower electrode 232 in the form of a pillar may be filled in the first trench 220t and the second trench 210t.

The lower electrode 232 may be deposited to cover not only the first trench 220t and the second trench 210t but also the upper surface of the pattering second sacrificial layer 176p. Thereafter, the upper surface of the lower electrode 232 may coincide with the upper surface of the second sacrificial layer 176p via a metal CMP (chemical mechanical polishing) process. However, the example embodiments are not limited thereto.

In concluding the detailed description, those skilled in the art will appreciate that many variations and modifications may be made to the preferred embodiments without substantially departing from the principles of the inventive concepts. Therefore, the disclosed preferred embodiments of the invention are used in a generic and descriptive sense only and not for purposes of limitation.

What is claimed is:

1. A method of manufacturing an interposer, the method comprising:
   providing a substrate including a first region and a second region adjacent to the first region;
   forming a first mold structure on the substrate;
   forming a photoresist layer on the first mold structure, the photoresist layer extending over the first region and the second region of the substrate;
   forming a first transfer pattern over the photoresist layer on the first region, using a first photomask;
   forming a second transfer pattern over the photoresist layer on the second region, using the first photomask;
   forming a mask pattern on the first mold structure, using the first transfer pattern and the second transfer pattern; and
   forming a first trench and a second trench in the first mold structure, using the mask pattern, the first trench being formed in the first region, and the second trench being formed in the second region,
   forming a first conductive layer which covers an inner wall of the first trench and an inner wall of the second trench,
   in each of the first trench and the second trench, the first conductive layer having an inner face facing a center of the first trench or the second trench, respectively, and an outer face facing away from the center of the first trench or second trench, respectively, the inner and outer faces being opposing faces of the first conductive layer;
   forming a support structure extending between and contacting the outer face of the first conductive layer in the first trench to the outer face of the first conductive layer in the second trench;
   forming a dielectric layer which covers the first conductive layer and the support structure, and, the dielectric layer contacting both the inner face of the first conductive layer and the outer face of the first conductive layer; and
   forming a second conductive layer on the dielectric layer such that the second conductive layer is within both the first trench and the second trench, and is both above and below the support structure, and the dielectric layer is between the first and second conductive layers.

2. The method of manufacturing the interposer of claim 1, further comprising:
   forming a first interlayer insulating layer on the second conductive layer.

3. The method of manufacturing the interposer of claim 2, after the forming of the first interlayer insulating layer, further comprising:
   forming a substrate penetration via penetrating the first interlayer insulating layer and extending into the substrate.

4. The method of manufacturing the interposer of claim 1, further comprising:
   forming a lower electrode in the first and second trenches; and
   patterning the first mold structure to form the support structure that supports a lower electrode.

5. The method of manufacturing the interposer of claim 4, the forming of the first trench and the second trench is performed after the support structure is formed.

6. The method of manufacturing the interposer of claim 4, further comprising:
   forming the dielectric layer which covers and contacts the support structure.

7. The method of manufacturing the interposer of claim 4, further comprising:
   forming a plate electrode between the substrate and the first mold structure, the plate electrode being electrically connected to the lower electrode.

8. A method of manufacturing an interposer, the method comprising:
   providing a substrate including a first region, and a second region adjacent to the first region;
   forming a first mold structure on the substrate;
   forming a photoresist layer on the first mold structure, the photoresist layer extending over the first region and the second region of the substrate;
   forming a first transfer pattern over the photoresist layer on the first region, using a first photomask;
   forming a second transfer pattern over the photoresist layer on the second region, using the first photomask;
   forming a mask pattern including a plurality of openings on the first mold structure, using the first transfer pattern and the second transfer pattern;
   forming a lower electrode in the first mold structure corresponding to the openings, in each of the openings, the lower electrode having an inner face facing a center of the opening and an outer face facing away from the center of the opening, the inner and outer faces being opposing faces of the lower electrode;
   forming a support structure extending between and contacting the outer face of the lower electrode in a first opening of the openings to the outer face of the lower electrode in a second opening of the openings;
   forming a dielectric layer which covers the lower electrode and the support structure, the dielectric layer contacting both the inner face of the lower electrode and the outer face of the lower electrode; and
   forming an upper electrode on the dielectric layer such that the dielectric layer is between the lower and upper electrodes, and the upper electrode is within the openings.

9. The method of manufacturing the interposer of claim 8, wherein of the forming the first mold structure includes
forming a first sacrificial layer,
forming a support structure layer on the first sacrificial layer, and
forming a second sacrificial layer on the first sacrificial layer,
the support structure layer between the first sacrificial layer and the second sacrificial layer.

10. The method of manufacturing the interposer of claim 9, further comprising:
patterning the first mold structure to form the support structure that supports the lower electrode and is a part of the support structure layer.

11. The method of manufacturing the interposer of claim 9, the method further comprising
removing the first and second sacrificial layers after forming the lower electrode and before forming the dielectric layer, the first and second trenches being formed through the first and second sacrificial layers and the support structure layer.

12. The method of manufacturing the interposer of claim 8, further comprising:
forming a first interlayer insulating layer on the upper electrode.

13. The method of manufacturing the interposer of claim 12, after the forming of the first interlayer insulating layer, further comprising:
forming a substrate penetration via penetrating the first interlayer insulating layer and extending into the substrate.

14. The method of manufacturing the interposer of claim 12, after the forming of the first interlayer insulating layer, further comprising:
penetrating the first interlayer insulating layer; and
forming a first electrode connection penetration via connected to the upper electrode, and a second electrode connection penetration via connected to the lower electrode.

15. The method of manufacturing the interposer of claim 8, wherein a plate electrode is formed between the substrate and the first mold structure, the plate electrode being electrically connected to the lower electrode.

16. A method of manufacturing an interposer, the method comprising:
providing a substrate including a first region and a second region adjacent to the first region;
forming a first mold structure on the substrate;
forming a first photoresist layer on the first mold structure, the first photoresist layer extending over the first region and the second region of the substrate;
forming a first transfer pattern over the first photoresist layer on the first region, using a first photomask;
forming a second transfer pattern over the first photoresist layer on the second region, using the first photomask;
forming a first mask pattern on the first mold structure, using the first transfer pattern and the second transfer pattern;
forming a first trench and a second trench in the first mold structure, using the first mask pattern;
forming a lower electrode which covers an inner wall of the first trench and an inner wall of the second trench, in each of the first trench and the second trench, the lower electrode having an inner face facing a center of the first trench or the second trench, respectively, and an outer face facing away from the center of the first trench or second trench, respectively, the inner and outer faces being opposing faces of the lower electrode;
forming a support structure extending between and contacting the outer face of the lower electrode in the first trench to the outer face of the lower electrode in the second trench;
forming a dielectric layer which covers the lower electrode and the support structure, the dielectric layer contacting both the inner face of the lower electrode and the outer face of the lower electrode;
forming an upper electrode on the dielectric layer such that the dielectric layer is between the upper electrode and the lower electrode, and the upper electrode is both above and below the support structure;
forming a first interlayer insulating layer on the upper electrode;
forming a second photoresist layer on the first interlayer insulating layer;
forming a third transfer pattern on the second photoresist layer, using a second photomask;
forming a second mask pattern disposed between the first interlayer insulating layer and the second photoresist layer, using the third transfer pattern;
forming a fourth transfer pattern on the second photoresist layer, using a third photomask; and
forming a third mask pattern disposed between the first interlayer insulating layer and the second photoresist layer, using the fourth transfer pattern,
a wiring layer being formed on the first interlayer insulating layer.

17. The method of manufacturing the interposer of claim 16, wherein the forming of the first mold structure includes
forming a first sacrificial layer,
forming a second sacrificial layer on the first sacrificial layer, and
forming a support structure layer between the first and second sacrificial layers.

18. The method of manufacturing the interposer of claim 17, further comprising:
patterning the first mold structure to form the support structure that supports the lower electrode and is a part of the support structure layer.

19. The method of manufacturing the interposer of claim 17, wherein the forming of the first trench and the second trench using the first mask pattern is performed after the forming of the support structure layer.

20. The method of manufacturing the interposer of claim 16, wherein the second photomask and the third photomask are different from each other, and the third transfer pattern and the fourth transfer pattern partially overlap in a partial region.

* * * * *